(12) United States Patent
Matsumura et al.

(10) Patent No.: US 12,084,559 B2
(45) Date of Patent: Sep. 10, 2024

(54) RESIN MOLDED BODY

(71) Applicant: SEKISUI TECHNO MOLDING CO., LTD., Tokyo (JP)

(72) Inventors: Ryuuji Matsumura, Nara (JP); Yuusuke Suenaga, Nara (JP); Takuya Masuda, Nara (JP); Takafumi Akiyama, Nara (JP)

(73) Assignee: SEKISUI TECHNO MOLDING CO., LTD., Tokyo (JP)

( * ) Notice: Subject to any disclaimer, the term of this patent is extended or adjusted under 35 U.S.C. 154(b) by 449 days.

(21) Appl. No.: 16/492,074

(22) PCT Filed: Apr. 23, 2018

(86) PCT No.: PCT/JP2018/016421
§ 371 (c)(1),
(2) Date: Sep. 6, 2019

(87) PCT Pub. No.: WO2018/199008
PCT Pub. Date: Nov. 1, 2018

(65) Prior Publication Data
US 2021/0108047 A1    Apr. 15, 2021

(30) Foreign Application Priority Data

Apr. 26, 2017   (JP) ................. 2017-086953
Sep. 29, 2017   (JP) ................. 2017-189626

(51) Int. Cl.
| H01B 1/24 | (2006.01) |
| C08K 3/04 | (2006.01) |
| C08L 23/06 | (2006.01) |
| C08K 3/08 | (2006.01) |

(52) U.S. Cl.
CPC .............. C08K 3/042 (2017.05); C08L 23/06 (2013.01); *C08K 2003/0856* (2013.01)

(58) Field of Classification Search
CPC ............... C08K 3/04; C08K 3/042; C08K 2003/0856; C08L 23/06; C08L 2207/04; B29C 70/04; B29C 70/06
See application file for complete search history.

(56) References Cited

U.S. PATENT DOCUMENTS

| 4,971,726 A * | 11/1990 | Maeno .............. H02G 15/003 252/511 |
| 4,973,514 A * | 11/1990 | Gamble ................ C08K 7/04 428/323 |
| 5,004,561 A | 4/1991 | Nomura et al. |
| 5,773,137 A | 6/1998 | Niitsuma et al. |
| 7,585,434 B2 * | 9/2009 | Morita ................ B82Y 30/00 524/495 |
| 2005/0238941 A1 | 10/2005 | Nishi et al. |
| 2013/0037760 A1 * | 2/2013 | Maeda ............... H01M 4/8631 252/511 |
| 2015/0257251 A1 * | 9/2015 | Kagawa ............. H01L 23/3737 252/79 |
| 2017/0225373 A1 | 8/2017 | Mitsutsuji et al. |
| 2017/0260346 A1 | 9/2017 | Hirata et al. |

FOREIGN PATENT DOCUMENTS

| CN | 1679191 A | 10/2005 |
| CN | 101072493 A | 11/2007 |
| CN | 105175907 A | 12/2015 |
| EP | 0 297 888 A1 | 1/1989 |
| EP | 1 553 651 A1 | 7/2005 |
| GB | 2 198 734 A | 6/1988 |
| JP | 56-72049 A | 6/1981 |
| JP | 62-172059 A | 7/1987 |
| JP | 7-53813 A | 2/1995 |
| JP | 9-7159 A | 1/1997 |
| JP | 11-71515 A | 3/1999 |
| JP | 2003-258491 A | 9/2003 |
| JP | 2004-95847 A | 3/2004 |
| JP | 2004-168897 A | 6/2004 |
| JP | 2006-257174 A | 9/2006 |
| JP | 2006-276424 A | 10/2006 |
| JP | 2011-192714 A | 9/2011 |
| JP | 5225558 B2 | 7/2013 |
| JP | 2016-111362 A | 6/2016 |

(Continued)

OTHER PUBLICATIONS

Machine translation of JP2004168897A.*
Electrical and mechanical properties of expanded graphite/high density polyethylene nanocomposites, Composites: Part B 53 (2013) 226-233.*
Examination Report for Application No. 201947042745 from Intellectual Property India Patent Office mailed Mar. 25, 2021.
Zhou, W. et al., "Thermally conductive polymer materials," 2014, pp. 28-29.
The First Office Action for the Application No. 201880007863.8 from The State Intellectual Property Office of the People's Republic of China dated May 7, 2021.
Database WPI Week 200449 Thomson Scientific, London, GB; AN 2004-510053, XP002801265 and JP 2004-168897 A.
Database WPI Week 200863, Thomson Scientific, London, GB; An 2008-K46982, XP002801266 and CN 101072493 A.

(Continued)

*Primary Examiner* — Haidung D Nguyen
(74) *Attorney, Agent, or Firm* — Cheng Law Group, PLLC

(57) ABSTRACT

Provided is a resin molded body having excellent electromagnetic wave shielding properties in a high-frequency region of 1 GHz or more. The resin molded body containing a thermoplastic resin, plate-like graphite, at least one of carbon black and metal fibers, the content of the plate-like graphite being 50 parts by weight or more and 200 parts by weight or less, relative to 100 parts by weight of the thermoplastic resin, the carbon black having a DBP oil absorption of 100 ml/100 g or more and 600 ml/100 g or less, the metal fibers having a diameter of 5 μm or more and 20 μm or less, the metal fibers having a fiber length of 2 mm or more and 12 mm or less, and the content of at least one of the carbon black and the metal fibers being 1 part by weight or more and 50 parts by weight or less, relative to 100 parts by weight of the thermoplastic resin.

9 Claims, 3 Drawing Sheets

(56) References Cited

FOREIGN PATENT DOCUMENTS

| JP | 2016-204570 A | 12/2016 |
|---|---|---|
| WO | WO-2009/075322 A1 | 6/2009 |
| WO | WO-2016/063855 A1 | 4/2016 |

OTHER PUBLICATIONS

Supplementary European Search Report for the Application No. EP 18 791 064.1 dated Dec. 9, 2020.
Written Opinion of the International Searching Authority (PCT/ISA/237) for Application No. PCT/JP2018/016421 mailed Jul. 24, 2018 (English translation mailed Nov. 7, 2019).
International Search Report for the Application No. PCT/JP2018/016421 mailed Jul. 24, 2018.
Written Opinion of the International Searching Authority (PCT/ISA/237) for Application No. PCT/JP2018/016421 mailed Jul. 24, 2018.
The Second Office Action for the Application No. 201880007863.8 from The State Intellectual Property Office of the People's Republic of China dated Jan. 18, 2022.
The Third Office Action for the Application No. 201880007863.8 from The State Intellectual Property Office of the People's Republic of China dated Jun. 13, 2022.
European Office Action for the Application No. 18 791 064.1 dated Jan. 31, 2024.

* cited by examiner

[FIG. 1]
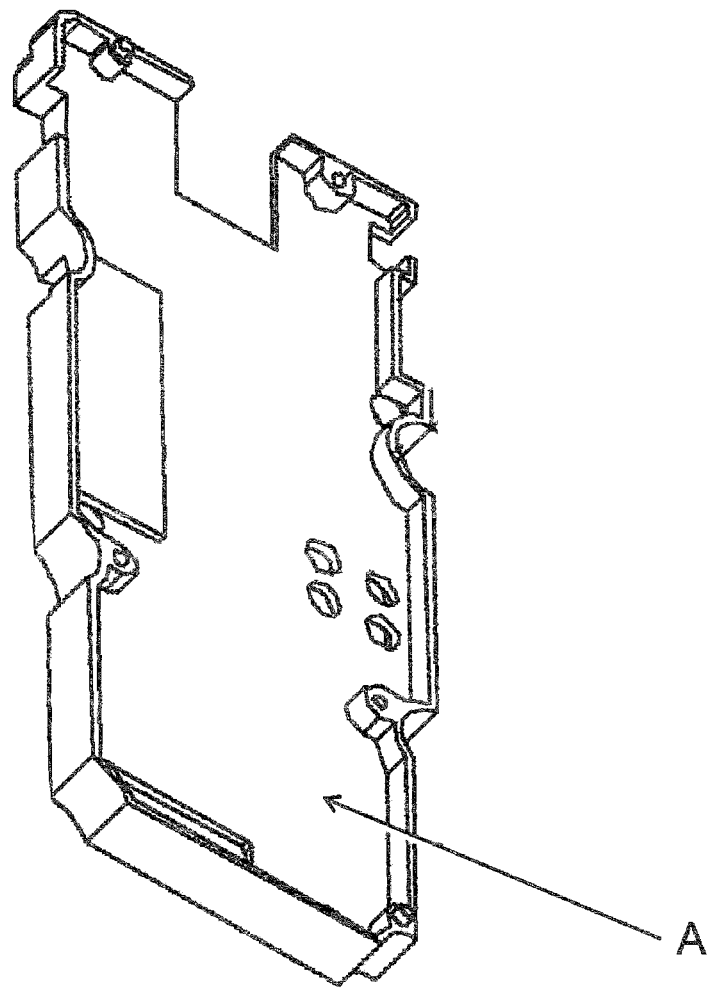

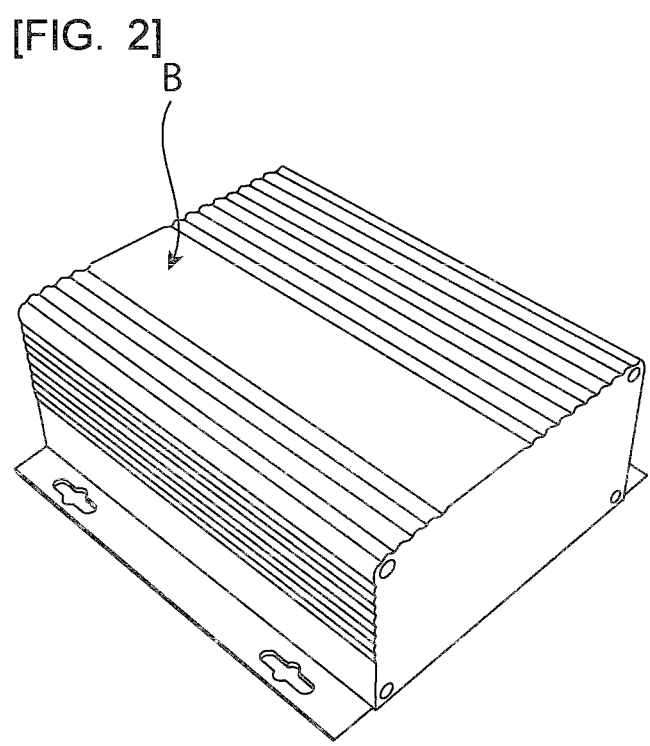
[FIG. 2]
B

[FIG. 3]
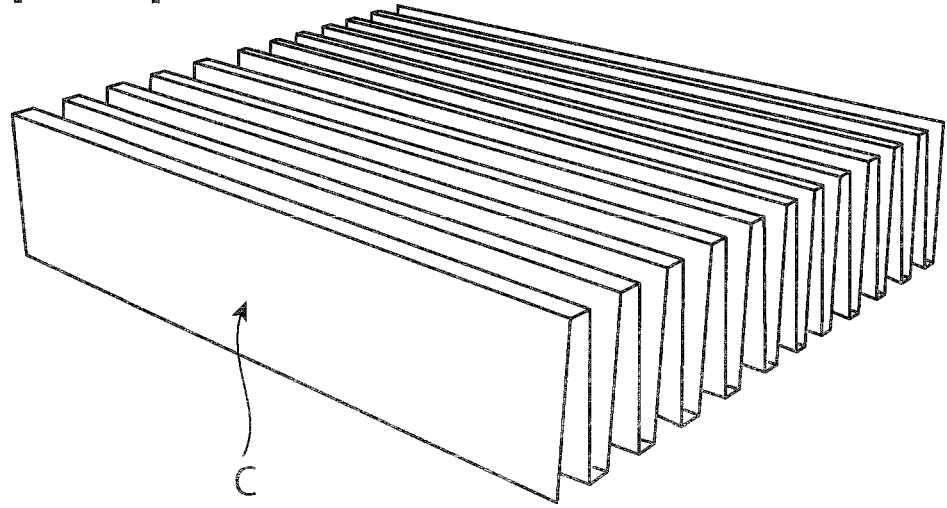
C

RESIN MOLDED BODY

TECHNICAL FIELD

The present invention relates to a resin molded body having electromagnetic wave shielding properties.

BACKGROUND ART

For a case housing an interior or exterior use communication device or an electronic device such as a car navigation system, a multi-information display (e.g., a smart meter), an in-vehicle camera, or an in-vehicle ECU, conventionally used is a conductive surface-treated product treated, for example, with a metal plate or conductive tape or by plating, vapor deposition, or coating to increase the electromagnetic wave shielding properties. Use of such a material, however, is not capable of contributing to reduction of weight of a product as well as it increases costs, so that an attempt of imparting the electromagnetic wave shielding properties to a resin molded body is being made in recent years.

For example, Patent Document 1 below discloses a molded body of a resin composition that contains a thermoplastic resin and graphite particles having an aspect ratio of 10 to 20 and a weight average particle size in a range of 10 μm to 200 μm. The resin composition contains 10 parts by mass to 1000 parts by mass of the graphite particles, relative to 100 parts by mass of the thermoplastic resin.

Patent Document 2 below discloses a molded body of a fiber-reinforced thermoplastic resin. The molded body contains 1 part by weight to 30 parts by weight of carbon fibers, 1 part by weight to 40 parts by weight of graphite, and 30 parts by weight to 98 parts by weight of a thermoplastic resin, relative to a total amount of 100 parts by weight of the carbon fibers, the graphite, and the thermoplastic resin. The carbon fibers have a weight average fiber length of 0.3 mm to 3 mm. The molded body has a specific gravity of 1.1 g/cm$^3$ to 1.9 g/cm$^3$.

Patent Document 3 below discloses a molded body of a resin-carbon composite material having carbon fibers and a graphite powder uniformly dispersed therein. A sum of the carbon fibers and the graphite powder is 20% by volume to 80% by volume. Patent Document 3 describes that the carbon fibers preferably have a thermal conduction of 100 W/(m·k) or more. Patent Document 3 also describes that the graphite power is preferably a spherical graphite powder containing 95% or more of fixed carbon.

RELATED ART DOCUMENTS

Patent Documents

Patent Document 1: JP 5225558 B
Patent Document 2: WO 2016/063855
Patent Document 3: WO 2009/075322

SUMMARY OF THE INVENTION

Problems to be Solved by the Invention

Along with a high-speed CPU, required electromagnetic wave shielding properties in recent years are not only for a frequency band of 0.1 MHz to 1 GHz that has been conventionally required, but also for a high-frequency region of 1 GHz or more Use of the molded bodies in Patent Documents 1 to 3 as cases, however, has not given sufficient electromagnetic wave shielding properties in the high-frequency region of 1 GHz or more.

An object of the present invention is to provide a resin molded body having excellent electromagnetic wave shielding properties in the high-frequency region of 1 GHz or more.

Means for Solving the Problems

A resin molded body according to the present invention contains a thermoplastic resin, plate-like graphite, at least one of carbon black and metal fibers, with the content of the plate-like graphite being 50 parts by weight or more and 200 parts by weight or less, relative to 100 parts by weight of the thermoplastic resin, the carbon black having a DBP oil absorption of 100 ml/100 g or more and 600 ml/100 g or less, the metal fibers having a diameter of 5 μm or more and 20 μm or less, the metal fibers having a fiber length of 2 mm or more and 12 mm or less, and the content of at least one of the carbon black and the metal fibers being 1 part by weight or more and 50 parts by weight or less, relative to 100 parts by weight of the thermoplastic resin.

In a specific aspect of the resin molded body according to the present invention, the resin molded body includes a main surface that has, with a direction in which electromagnetic wave shielding effect is maximum defined as an x-direction and a direction perpendicular to the x-direction defined as a y-direction, a ratio $a\lambda y/a\lambda x$ of a y-direction electromagnetic wave shielding effect at a frequency of 10 MHz $a\lambda y$ to an x-direction electromagnetic wave shielding effect at a frequency of 10 MHz $a\lambda x$ of 0.90 or more, and that has a ratio $b\lambda y/b\lambda x$ of a y-direction electromagnetic wave shielding effect at any one of frequencies of 25 GHz, 50 GHz, and 75 GHz $b\lambda y$ to an x-direction electromagnetic wave shielding effect at a frequency identical with the any one of the frequencies of 0.90 or more $b\lambda x$.

In another specific aspect of the resin molded body according to the present invention, an electromagnetic wave shielding effect at any one of 3 GHz, 25 GHz, 50 GHz, and 75 GHz is 20 dB or more.

In another specific aspect of the resin molded body according to the present invention, the plate-like graphite has a volume average particle size of 5 μm or more and 500 μm or less.

In another specific aspect of the resin molded body according to the present invention, the plate-like graphite is exfoliated graphite.

In another specific aspect of the resin molded body according to the present invention, the carbon black is oil-furnace black.

In another specific aspect of the resin molded body according to the present invention, the carbon black has a primary particle size of 50 nm or less.

In another specific aspect of the resin molded body according to the present invention, the metal fibers are stainless steel fibers.

In another specific aspect of the resin molded body according to the present invention, the resin molded body further contains a non-conductive fibrous filler different from the metal fibers.

In another specific aspect of the resin molded body according to the present invention, the content of the fibrous filler is 1 part by weight or more and 200 parts by weight or less, relative to 100 parts by weight of the thermoplastic resin.

In another specific aspect of the resin molded body according to the present invention, the thermoplastic resin is an olefin resin.

In another specific aspect of the resin molded body according to the present invention, the main surface has an in-plane thermal conductivity of 1 W/(m·K) or more.

In another specific aspect of the resin molded body according to the present invention, the resin molded body is a heat dissipation chassis or a heat dissipation case or has a heat sink shape.

Effect of the Invenntion

According to the present invention, it is possible to provide a resin molded body having excellent electromagnetic wave shielding properties in a high-frequency region of 1 GHz or more.

BRIEF DESCRIPTION OF DRAWINGS

FIG. 1 is a schematic perspective view of a heat dissipation chassis.

FIG. 2 is a schematic perspective view of a heat dissipation case.

FIG. 3 is a schematic perspective view of a heat sink shape.

MODES FOR CARRYING OUT THE INVENTION

Hereinafter, the present invention is described in detail.

A resin molded body according to the present invention contains a thermoplastic resin, plate-like graphite, and at least one of carbon black and metal fibers. The carbon black has a DBP oil absorption of 100 ml/100 g or more and 600 ml/100 g or less. The metal fibers have a diameter of 5 μm or more and 20 μm or less. The metal fibers have a fiber length of 2 mm or more and 12 mm or less. The content of the plate-like graphite is 50 parts by weight or more and 200 parts by weight or less, relative to 100 parts by weight of the thermoplastic resin. The content of at least one of the carbon black and the metal fibers is 1 part by weight or more and 50 parts by weight or less, relative to 100 parts by weight of the thermoplastic resin.

In the present invention, it is possible to measure the DBP oil absorption of the carbon black in accordance with JIS K 6217-4. It is possible to measure the DBP oil absorption with, for example, an absorption tester (manufactured by ASAHISOUKEN CORPORATION, item No. "S-500").

It is possible to measure the diameter and the fiber length of the metal fibers with, for example, a scanning electron microscope (SEM). From a viewpoint of further facilitating the observation, it is desirable to heat a test piece cut out from the resin molded body at 600° C. to evaporate the resin and observe with a scanning electron microscope (SEM).

The resin molded body according to the present invention has excellent electromagnetic wave shielding properties in a high-frequency region of 1 GHz or more because it contains the plate-like graphite and at least one of the specific carbon black and metal fibers at a specific ratio. The resin molded body according to the present invention is capable of decreasing the anisotropy of the electromagnetic wave shielding properties and thus increasing the reliability of a product such as an electronic device.

The inventors of the present application have found that the electromagnetic wave shielding properties as described above are exhibited, on the basis of a percolation theory representing how conductive particles of plate-like graphite are connected to each other in an object substance.

Specifically, the inventors have found that addition of carbon black having a DBP oil absorption in a specific range or metal fibers having a specific diameter and a specific fiber length at specific amounts in the presence of a specific amount of plate-like graphite enables efficient percolation and thus an increase in electromagnetic wave shielding properties in a high-frequency region of 1 GHz or more.

Particularly, in the present invention, an electromagnetic wave shielding effect at any one of frequencies of 3 GHz, 25 GHz, 50 GHz, and 75 GHz is preferably 20 dB or more, more preferably 30 dB or more, further preferably 40 dB or more. An upper limit value of the electromagnetic wave shielding effect is not particularly limited and is, for example, 70 dB.

It is possible to measure the electromagnetic wave shielding effect (electromagnetic wave shielding performance) at a frequency of 3 GHz by, for example, a Dual-Focus Flat Cavity (DFFC) method. It is possible to measure the electromagnetic wave shielding effect at a frequency of 25 GHz, 50 GHz, or 75 GHz by, for example, a Free Space (FS) method.

The resin molded body according to the present invention also has excellent heat dissipation properties because it contains the plate-like graphite and at least one of the carbon black and the metal fibers that have high thermal conductance.

In the present invention, the resin molded body includes a main surface having an in-plane thermal conductivity of preferably 1 W/(m·K) or more, more preferably 3 W/(m·K) or more, further preferably 5 W/(m·K) or more. An upper limit value of the in-plane thermal conductivity is not particularly limited and is, for example, 50 W/(m·K).

The main surface may be a flat surface or a curved surface. The main surface in the present invention refers to a surface that has the largest area among a plurality of outer surfaces of the resin molded body and that is a continuous surface.

It is possible to calculate the in-plane thermal conductivity by the following equation (1).

$$\text{Thermal conductivity (W/(m·K))} = \text{Density (g/cm}^3\text{)} \times \text{Specific heat (J/(g·K))} \times \text{Coefficient of thermal diffusivity (mm}^2\text{/s)} \quad \text{Equation (1)}$$

It is possible to measure the coefficient of thermal diffusivity with, for example, item No. "Xenon flash laser analyzer LFA467 HyperFlash" manufactured by NETZSCH Japan K.K.

The resin molded body according to the present invention is excellent in both electromagnetic wave shielding properties and heat dissipation properties, so that it is possible to suitably use the resin molded body for a case that is required to have the electromagnetic wave shielding properties to house a communication device or an electronic device such as a smart meter or an in-vehicle ECU.

In the main surface of the resin molded body, a direction in which electromagnetic wave shielding effect is maximum is defined as an x-direction and a direction perpendicular to the x-direction is defined as a y-direction. At this time, a ratio $a\lambda y/a\lambda x$ of a y-direction electromagnetic wave shielding effect at a frequency of 10 MHz $a\lambda y$ to an x-direction electromagnetic wave shielding effect at a frequency of 10 MHz $a\lambda x$ is preferably 0.90 or more. The ratio $a\lambda y/a\lambda x$ is more preferably 0.92 or more, further preferably 0.95 or more. An upper limit of the ratio $a\lambda y/a\lambda x$ is not particularly limited but is preferably 1.00 or less, for example.

Further, a ratio bλy/bλx of a y-direction electromagnetic wave shielding effect at any one of frequencies of 25 GHz, 50 GHz, and 75 GHz bλy to an x-direction electromagnetic wave shielding effect at a frequency identical with the any one of the frequencies bλx is preferably 0.90 or more. The ratio bλy/bλx is more preferably 0.92 or more, further preferably 0.95 or more. An upper limit of the ratio bλy/bλx is not particularly limited but is preferably 1.00 or less, for example.

When the ratios aλy/aλx and bλy/bλx are in the above ranges, it is possible to further decrease the anisotropy of the electromagnetic wave shielding performance and thus further increase the reliability of a product such as an electronic device.

It is possible to adjust the ratios aλy/aλx and bλy/bλx within the above ranges by, for example, addition of carbon black having a DBP oil absorption in a specific range and metal fibers having a specific diameter and fiber length at a specific amount in the presence of a specific amount of plate-like graphite as described above.

It is possible to measure the electromagnetic wave shielding effect at a frequency of 10 MHz by a KEC method (abbreviation of "KEC Electronic Industry Development Center").

As regards the anisotropy of the electromagnetic wave shielding performance, a sample piece with length 150 mm×width 150 mm×thickness 2 mm is set at any direction whose position is defined as 0°, and the sample is rotated by 15° intervals. The sample is measured for its electromagnetic wave shielding effect at 0°, 15°, 30°, 45°, 60°, 75°, 90°, 105°, 120°, 135°, 150°, 165°, and 180°, and a direction in which electromagnetic wave shielding effect is maximum is defined as the x-direction, and a direction perpendicular to the x-direction is defined as the y-direction.

When having a thickness of more than 2 mm, the sample piece is sliced into a thickness of 2 mm and used.

The resin molded body according to the present invention is preferably a molded body of a resin composition containing the thermoplastic resin, the plate-like graphite, and at least one of the carbon black and the metal fibers. It is possible to obtain the resin molded body according to the present invention by subjecting the resin composition to molding by a method such as press working, extruding, extrusion lamination, or injection molding.

In the present invention, the plate-like graphite has a volume average particle size of preferably 5 μm or more, more preferably 30 μm or more, further preferably 60 μm or more and preferably 500 μm or less, more preferably 350 μm or less, further preferably 200 μm or less. When the plate-like graphite has a volume average particle size of the above lower limit or more, it is possible to further increase the electromagnetic wave shielding properties and the heat dissipation properties. On the other hand, when the plate-like graphite has a volume average particle size of the above upper limit or less, it is possible to further increase the impact resistance of the resin molded body. As long as the plate-like graphite contained in the resin composition of the present invention has a volume average particle size within the above range, two or more types of graphite particles having different particles sizes may be used in combination.

In the present invention, the volume average particle size refers to a value calculated in a volume-based distribution obtained with a laser diffraction-scattering type particle size distribution measuring device by a laser diffraction method in accordance with JIS Z 8825: 2013.

For example, the plate-like graphite is charged into an aqueous soap solution (neutral detergent: 0.01% contained) to give a plate-like graphite concentration of 2% by weight, and irradiated for 1 minute with ultrasonic waves at an output of 300 W, using an ultrasonic homogenizer to give a suspension. Next, the suspension is measured for the volume particle size distribution of the plate-like graphite by a laser diffraction-scattering type particle size analyzer (manufactured by NIKKISO CO., LTD., product name "Microtrac MT3300"). It is possible to calculate a value at a cumulative volume of 50% in the volume particle size distribution as the volume average particle size of the plate-like graphite.

In the present invention, the carbon black has a primary particle size of preferably 40 nm or more and preferably 50 nm or less, more preferably 45 nm or less. When the carbon black has a primary particle size within the above range, it is possible to obtain a further high electromagnetic wave shielding effect, with the content of the carbon black giving a further lower concentration.

It is possible to obtain the primary particle size of the carbon black by, for example, using image data of the carbon black obtained with a transmission electron microscope. As the transmission electron microscope, it is possible to use, for example, trade name "JEM-2200FS" manufactured by JEOL Ltd.

The resin molded body according to the present invention may be a heat dissipation chassis or a heat dissipation case or has a heat sink shape.

FIG. 1 is a schematic view of a heat dissipation chassis. When the resin molded body is a heat dissipation chassis, a part pointed out by the arrow A in FIG. 1 is the main surface.

FIG. 2 is a schematic view of a heat dissipation case. When the resin molded body is a heat dissipation case, a part pointed out by the arrow B in FIG. 2 is the main surface. As shown in FIGS. 1 and 2, the main surface may include a protrusion and a recess.

FIG. 3 is a schematic view of a heat sink shape. When the resin molded body has a heat sink shape, a part pointed out by the arrow C in FIG. 3 is the main surface. In this case, the main surface also corresponds to a plurality of surfaces that are connected through a small surface to the main surface pointed out by the arrow C and has almost the same size as the main surface pointed out by the arrow C. Thus, the resin molded body may have a plurality of main surfaces.

Hereinafter, materials forming the resin molded body according to the present invention are described in detail.
(Thermoplastic Resin)

The thermoplastic resin is not particularly limited, and it is possible to use a known thermoplastic resin. Specific examples of the thermoplastic resin include a polyolefin, a polystyrene, a polyacrylate, a polymethacrylate, a polyacrylonitrile, a polyester, a polyamide, a polyurethane, a polyethersulfone, a polyetherketone, a polyimide, a polydimethylsiloxane, a polycarbonate, a polyphenylsulfide, and a copolymer of at least two of these thermoplastic resins. The thermoplastic resins may be used alone or in combination of a plurality thereof.

The thermoplastic resin is preferably a resin having a high elastic modulus. A polyolefin is more preferable because it is cheap and facilitates molding under heating.

The polyolefin is not particularly limited, and it is possible to use a known polyolefin. Specific examples of the polyolefin include polyethylene resins such as an ethylene homopolymer, i.e., polyethylene, an ethylene-α-olefin copolymer, an ethylene-(meth)acrylic acid copolymer, an ethylene-(meth)acrylic acid ester copolymer, and an ethylene-vinyl acetate copolymer. The polyolefin may be a polypropylene resin such as a propylene homopolymer, i.e., polypropylene or a propylene-α-olefin copolymer, a butene homopolymer, i.e., polybutene, or a homopolymer or a copolymer of a conjugated diene such as butadiene or isoprene. These polyolefins may be used alone or in combination of a plurality thereof. From a viewpoint of further increasing the heat resistance and the elastic modulus, the polyolefin is preferably polypropylene.

The polyolefin (olefin resin) preferably contains an ethylene component. The content of the ethylene component is preferably 5% by mass to 40% by mass. When the content of the ethylene component is within the above range, it is possible to further increase the heat resistance while further increasing the impact resistance of the resin molded body.
(Plate-Like Graphite)

The plate-like graphite is not particularly limited as long as it is graphite having a plate shape, and it is possible to use, for example, graphite, exfoliated graphite, or graphene. From a viewpoint of further increasing the electromagnetic wave shielding properties and the thermal diffusivity, the plate-like graphite is preferably graphite or exfoliated graphite, more preferably exfoliated graphite. These types of plate-like graphite may be used alone or in combination of a plurality thereof. In the present invention, the plate-like graphite may be scale-like graphite.

The exfoliated graphite is obtained by peeling original graphite and refers to a graphene sheet laminate thinner than the original graphite. As the peeling for forming the exfoliated graphite, either one of mechanical peeling with use of, for example, a supercritical fluid and chemical peeling with use of an acid may be used. The number of laminated graphene sheets in the exfoliated graphite is acceptable as long as it is smaller than that in the original graphite. The number of laminated graphene sheets in the exfoliated graphite, however, is preferably 1000 layers or less, more preferably 500 layers or less, further preferably 200 layers or less.

The content of the plate-like graphite is 50 parts by weight or more, preferably 70 parts by weight or more, more preferably 100 parts by weight or more and 200 parts by weight or less, preferably 180 parts by weight or less, more preferably 150 parts by weight or less, relative to 100 parts by weight of the thermoplastic resin. When the content of the plate-like graphite is the above lower limit or more, it is possible to further increase the electromagnetic wave shielding properties and the heat dissipation properties. An excessively large content of the plate-like graphite increases the area of an interface to be a starting point of breakage, so that when the content of the plate-like graphite is the above upper limit or less, it is possible to further increase the impact resistance.

The plate-like graphite has an aspect ratio of preferably 5 or more, more preferably 21 or more and preferably less than 2000, more preferably less than 1000, further preferably less than 100. When the plate-like graphite has an aspect ratio of the above lower limit or more, it is possible to further increase the in-plane heat dissipation properties. When the plate-like graphite has an aspect ratio of less than the above upper limit, the graphite particles themselves are more unlikely to bend in the thermoplastic resin, for example, during injection molding. Therefore, it is possible to further increase the electromagnetic wave shielding performance. In the present specification, the aspect ratio refers to a ratio of a maximum dimension along a lamination plane of the plate-like graphite to the thickness of the plate-like graphite.

It is possible to measure the thickness of the plate-like graphite with, for example, a transmission electron microscope (TEM) or a scanning electron microscope (SEM). From a viewpoint of further facilitating the observation, it is desirable to heat a test piece cut out from the resin molded body at 600° C. to evaporate the resin and observe with a transmission electron microscope (TEM) or a scanning electron microscope (SEM), the plate-like graphite that are obtained by heating a test piece cut out from the resin molded body at 600° C. to evaporate the resin. The test piece may be cut out along the main surface of the resin molded body or along a direction perpendicular to the main surface of the resin molded body, as long as the test piece allows the measurement of the thickness of the plate-like graphite after the evaporation of the resin.
(Carbon Black and Metal Fibers)

The resin molded body according to the present invention may contain at least one of the carbon black and the metal fibers. Accordingly, the resin molded body may contain only the carbon black or may contain only the metal fibers. Alternatively, the resin molded body may contain both the carbon black and the metal fibers.

The carbon back has a DBP oil absorption of 100 ml/100 g or more, preferably 180 ml/100 g or more and 600 ml/100 g or less, preferably 450 ml/100 g or less, more preferably 300 ml/100 g or less. When the carbon black has a DBP oil absorption of the above lower limit or more, it is possible to further increase the electromagnetic wave shielding properties of the resin molded body. When the carbon black has a DBP oil absorption of the above upper limit or less, it is possible to prevent aggregation during kneading and thus further improve the stability.

As the carbon black, it is possible to use, for example, oil-furnace black such as ketjenblack, acetylene black, channel black, or thermal black. Among these types of carbon black, oil-furnace black is preferable from a viewpoint of further increasing the electromagnetic wave shielding properties of the resin molded body. The carbon black may contain metal impurities such as Fe and Ni.

The metal fibers have a diameter of 5 μm or more, preferably 7 μm or more and 20 μm or less, preferably 15 μm or less.

The metal fibers have a fiber length of 2 mm or more, preferably 4 mm or more and 12 mm or less, preferably 10 mm or less.

Examples of the metal fibers include stainless steel fibers and metal fibers obtained by metal-coating aramid fibers with, for example, copper. Among these types of metal fibers, stainless steel fibers are preferable from a viewpoint of further increasing the electromagnetic wave shielding properties of the resin molded body.

The content of at least one of the carbon black and the metal fibers is 1 part by weight or more, preferably 3 parts by weight or more, more preferably 5 parts by weight or more and 50 parts by weight or less, preferably 45 parts by weight or less, more preferably 40 parts by weight or less, relative to 100 parts by weight of the thermoplastic resin. When the content of at least one of the carbon black and the metal fibers is the above lower limit or more, it is possible to further increase the electromagnetic wave shielding properties and the heat dissipation properties. When the content of at least one of the carbon black and the metal fibers is the above lower limit or more, it is possible to further increase the electromagnetic wave shielding properties. When the content of at least one of the carbon black and the metal fibers is the above upper limit or less, it is possible to further increase the balance between the electromagnetic wave shielding effect and the impact resistance.
(Fibrous Filler)

The resin molded body according to the present invention may further contain a non-conductive fibrous filler different from the metal fibers. Examples of the fibrous filler include carbon fibers and glass fibers.

The content of the fibrous filler is not particularly limited but is preferably 1 part by weight or more and 200 parts by weight or less, relative to 100 parts by weight of the thermoplastic resin. When the content of the fibrous filler is within the above range, it is possible to impart further excellent fluidity to the resin composition for forming the resin molded body.

The carbon fibers are not particularly limited, and it is possible to use, for example, PAN-based or PITCH-based carbon fibers.

(Other Additives)

The resin molded body may contain various additives as optional components. Examples of the additives include a phenolic, phosphorous, amine-based, or sulfuric antioxidant; a benzotriazole-based or hydroxyphenyltriazine-based ultraviolet absorber; and a metal harm inhibitor. The additives may also be, for example, a halogenated flame retardant such as hexabromobiphenyl ether or decabromodiphenyl ether; a flame retardant such as ammonium polyphosphate or trimethyl phosphate; various fillers; an antistatic agent; a stabilizer; and a pigment. These additives may be used alone or in combination of a plurality thereof.

(Plating)

The resin molded body according to the present invention may be subjected to plating. The plating is capable of further effectively imparting the electromagnetic wave shielding properties and earthing performance required of a case of, for example, an ECU.

The type of plating is not particularly limited, but copper plating is preferably performed. Use of copper plating is capable of further making the heat dissipation properties and the impact properties more excellent.

It is possible to manufacture the resin molded body according to the present invention by, for example, the following method.

First prepared is the resin composition containing, for example, the thermoplastic resin, the plate-like graphite, and the carbon black or the metal fibers. The resin composition may further contain various materials described above. In the resin composition, the plate-like graphite is preferably dispersed in the thermoplastic resin. The dispersion enables a further increase in electromagnetic wave shielding properties of the resin molded body obtained. The method of dispersing the plate-like graphite in the thermoplastic resin is not particularly limited, and it is possible to knead the thermoplastic resin, which has been heat-melted, with the plate-like graphite for further uniform dispersion.

The kneading method is not particularly limited, and examples thereof include a method of kneading the thermoplastic resin and the plate-like graphite under heating, with a kneading apparatus such as a twin-screw kneader (e.g., PLASTOMILL), a kneader, a single-screw extruder, a twin-screw extruder, a twin-screw single-screw extruder, a twin taper screw extruder, a feeder ruder extruder, a plunger extruder, a Banbury mixer, or a roll. Among these kneading apparatuses, a melt kneading method with an extruder is preferable.

Next, the prepared resin composition is subjected to molding by a method such as press working, extruding, extrusion lamination, or injection molding to give a resin molded body.

Thus, as regards the resin molded body according to the present invention, it is possible to appropriately adjust the physical properties of the resin molded body according to the purpose of use.

Hereinafter, the effects of the present invention are clarified with reference to specific examples of the present invention and comparative examples. The present invention is not to be limited to the following examples.

Example 1

Polypropylene (PP) as the thermoplastic resin in an amount of 100 parts by weight, 100 parts by weight of scale-like graphite particles as the plate-like graphite particles, and 10 parts by weight of oil-furnace black as the carbon black were melt-kneaded at 200° C. with LABO PLASTOMILL (manufactured by Toyo Seiki Seisaku-sho, Ltd., item No. "R100") to give a resin composition. The obtained resin composition was subjected to injection molding at a resin composition temperature of 230° C. and a mold temperature of 40° C. to give a resin molded body with length 300 mm×width 300 mm×thickness 2 mm. As the polypropylene was used trade name "BC10HRF" manufactured by Japan Polypropylene Corporation. As the scale-like graphite particles was used trade name "CNP35" (average particle size: 35 μm) manufactured by Ito Graphite Co., Ltd. As the oil-furnace black was used trade name "EC200L" (DBP oil absorption: 300 ml/100 g, primary particle size: 41 nm) manufactured by LION SPECIALTY CHEMICALS CO., LTD.

Example 2

A resin molded body was obtained in the same manner as in Example 1 except that the addition amount of the scale-like graphite particles was changed to 70 parts by weight.

Example 3

A resin molded body was obtained in the same manner as in Example 1 except that the addition amount of the scale-like graphite particles was changed to 150 parts by weight.

Example 4

A resin molded body was obtained in the same manner as in Example 1 except that the addition amount of the scale-like graphite particles was changed to 180 parts by weight.

Example 5

A resin molded body was obtained in the same manner as in Example 1 except that the addition amount of the carbon black was changed to 5 parts by weight.

Example 6

A resin molded body was obtained in the same manner as in Example 1 except that the addition amount of the carbon black was changed to 20 parts by weight.

Example 7

A resin molded body was obtained in the same manner as in Example 1 except that the addition amount of the carbon black was changed to 30 parts by weight.

Example 8

A resin molded body was obtained in the same manner as in Example 1 except that the addition amount of the carbon black was changed to 45 parts by weight.

Example 9

A resin molded body was obtained in the same manner as in Example 1 except that oil-furnace black (manufactured by LION SPECIALTY CHEMICALS CO., LTD., trade name "EC600JD") having a DBP oil absorption of 495 ml/100 g and a primary particle size of 34 nm was used as the carbon black.

Example 10

A resin molded body was obtained in the same manner as in Example 1 except that oil-furnace black (manufactured by LION SPECIALTY CHEMICALS CO., LTD., trade name "EC300J") having a DBP oil absorption of 365 ml/100 g and a primary particle size of 40 nm was used as the carbon black.

Example 11

A resin molded body was obtained in the same manner as in Example 1 except that oil-furnace black (manufactured by Asahi Carbon Co., Ltd., trade name "F-200GS") having a DBP oil absorption of 180 ml/100 g and a primary particle size of 30 nm was used as the carbon black.

Example 12

A resin molded body was obtained in the same manner as in Example 1 except that acetylene black (manufactured by Denka Company Limited, trade name "Li-400") having a DBP oil absorption of 177 ml/100 g and a primary particle size of 48 nm was used as the carbon black.

Example 13

A resin molded body was obtained in the same manner as in Example 1 except that scale-like graphite particles (manufactured by Ito Graphite Co., Ltd., trade name "PC-H") having an average particle size of 7 μm were used.

Example 14

A resin molded body was obtained in the same manner as in Example 1 except that scale-like graphite particles (manufactured by Nippon Graphite Industries, Co., Ltd., trade name "F #2") having an average particle size of 140 μm were used.

Example 15

A resin molded body was obtained in the same manner as in Example 1 except that scale-like graphite particles (manufactured by Chuetsu Graphite Works Co., Ltd., trade name "CPB-80") having an average particle size of 300 μm were used.

Example 16

A resin molded body was obtained in the same manner as in Example 1 except that as the plate-like graphite particles, exfoliated graphite (manufactured by Nippon Graphite Industries, Co., Ltd., trade name "UP-35N") having an average particle size of 30 μm was used in place of the scale-like graphite particles.

Example 17

A resin molded body was obtained in the same manner as in Example 1 except that as the plate-like graphite particles, exfoliated graphite (manufactured by ITEC Co. Ltd., trade name "iGrafen-α") having an average particle size of 100 μm was used in place of the scale-like graphite particles.

Example 18

A resin molded body was obtained in the same manner as in Example 1 except that as the plate-like graphite particles, exfoliated graphite (manufactured by Chuetsu Graphite Works Co., Ltd., trade name "BSP-300AK") having an average particle size of 300 μm was used in place of the scale-like graphite particles.

Example 19

Polypropylene (PP) as the thermoplastic resin in an amount of 100 parts by weight, 100 parts by weight of scale-like graphite particles as the graphite particles, and 10 parts by weight of stainless steel long fibers (stainless steel fibers) as the metal fibers were melt-kneaded at 200° C. with LABO PLASTOMILL (manufactured by Toyo Seiki Seisaku-sho, Ltd., item No. "R100") to give a resin composition. The obtained resin composition was subjected to injection molding at a resin composition temperature of 230° C. and a mold temperature of 40° C. to give a resin molded body with length 300 mm×width 300 mm×thickness 2 mm. As the polypropylene was used trade name "BC10HRF" manufactured by Japan Polypropylene Corporation. As the scale-like graphite particles was used trade name "CNP35" (average particle size: 35 μm) manufactured by Ito Graphite Co., Ltd. As the stainless steel long fibers (stainless steel fibers) was used stainless steel long-fiber masterbatch (manufactured by Daicel Polymer ltd., trade name "PP-SF50," concentration: 50%, diameter: 10 μm, fiber length: 7 mm).

Example 20

A resin molded body was obtained in the same manner as in Example 18 except that the addition amount of the stainless steel fibers was changed to 5 parts by weight.

Example 21

A resin molded body was obtained in the same manner as in Example 18 except that the addition amount of the stainless steel fibers was changed to 20 parts by weight.

Example 22

A resin molded body was obtained in the same manner as in Example 18 except that the addition amount of the stainless steel fibers was changed to 30 parts by weight.

Example 23

A resin molded body was obtained in the same manner as in Example 1 except that an acrylonitrile-butadiene-styrene copolymer (ABS) (manufactured by Asahi Kasei Corporation, trade name "STYLAC 181") was used as the thermoplastic resin.

Example 24

A resin molded body was obtained in the same manner as in Example 1 except that a polyamide (PA) (manufactured by Toray Industries, Inc., trade name "AMILAN CM1007") was used as the thermoplastic resin.

Example 25

A resin molded body was obtained in the same manner as in Example 1 except that polycarbonate (PC) (manufactured by Mitsubishi Engineering-Plastics Corporation, trade name "NOVAREX 7020R") was used as the thermoplastic resin.

Example 26

A resin molded body was obtained in the same manner as in Example 1 except that polyphenylenesulfide (PPS) (manufactured by Toray Industries, Inc., trade name "TORELINA A900") was used as the thermoplastic resin.

Example 27

A resin molded body was obtained in the same manner as in Example 1 except that polybutylene terephthalate (PBT) (manufactured by Mitsubishi Engineering-Plastics Corporation, trade name "NOVADURAN 5010R5") was used as the thermoplastic resin.

Example 28

A resin molded body was obtained in the same manner as in Example 1 except that syndiotactic polystyrene (SPS) (manufactured by Idemitsu Kosan Co., Ltd. "XAREC SP130") was used as the thermoplastic resin.

Example 29

A resin molded body was obtained in the same manner as in Example 1 except that 20 parts by weight of glass fibers (glass long-fiber masterbatch, manufactured by Japan Polypropylene Corporation, trade name "LR26Y," glass fiber content: 58%) were further added as the fibrous filler.

Example 30

A resin molded body was obtained in the same manner as in Example 1 except that 100 parts by weight of glass fibers (glass long-fiber masterbatch, manufactured by Japan Polypropylene Corporation, trade name "LR26Y," glass fiber content: 58%) were further added as the fibrous filler.

Comparative Example 1

Polypropylene (PP, manufactured by Japan Polypropylene Corporation, trade name "BC10HRF") as the thermoplastic resin in an amount of 100 parts by weight and 100 parts by weight of scale-like graphite particles (manufactured by Ito Graphite Co., Ltd., trade name "CNP35", average particle size: 35 μm) were melt-kneaded at 200° C. with LABO PLASTOMILL (manufactured by Toyo Seiki Seisaku-sho, Ltd., item No. "R100") to give a resin composition. The obtained resin composition was subjected to injection molding at a resin composition temperature of 230° C. and a mold temperature of 40° C. to give a resin molded body with length 300 mm×width 300 mm×thickness 2 mm.

Comparative Example 2

Polypropylene (PP) as the thermoplastic resin in an amount of 100 parts by weight and 10 parts by weight of oil-furnace black as the carbon black were melt-kneaded at 200° C. with LABO PLASTOMILL (manufactured by Toyo Seiki Seisaku-sho, Ltd., item No. "R100") to give a resin composition. The obtained resin composition was subjected to injection molding at a resin composition temperature of 230° C. and a mold temperature of 40° C. to give a resin molded body with length 300 mm×width 300 mm×thickness 2 mm. As the polypropylene was used trade name "BC10HRF" manufactured by Japan Polypropylene Corporation. As the oil-furnace black was used trade name "EC600JD" (DBP oil absorption: 495 ml/100 g, primary particle size: 34 nm) manufactured by LION SPECIALTY CHEMICALS CO., LTD.

Comparative Example 3

A resin molded body was obtained in the same manner as in Example 1 except that 100 parts by weight of spherical graphite (manufactured by Ito Graphite Co., Ltd., trade name "SG-BL40," average particle size: 40 μm) were used in place of the scale-like graphite particles in Example 1.

Comparative Example 4

Polypropylene (PP, manufactured by Japan Polypropylene Corporation, trade name "BC10HRF") as the thermoplastic resin in an amount of 100 parts by weight and 5 parts by weight of stainless steel long fibers (stainless steel fibers) as the metal fibers were melt-kneaded at 200° C. with LABO PLASTOMILL (manufactured by Toyo Seiki Seisaku-sho, Ltd., item No. "R100") to give a resin composition. The obtained resin composition was subjected to injection molding at a resin composition temperature of 230° C. and a mold temperature of 40° C. to give a resin molded body with length 300 mm×width 300 mm×thickness 2 mm. As the stainless steel long fibers (stainless steel fibers) was used stainless steel long-fiber masterbatch (manufactured by Daicel Polymer ltd., trade name "PP-SF50," concentration: 50%, diameter 10 μm, fiber length: 7 mm).

Comparative Example 5

Polypropylene (PP) as the thermoplastic resin in an amount of 100 parts by weight and 100 parts by weight of carbon fibers as the fibrous filler were melt-kneaded at 200° C. with LABO PLASTOMILL (manufactured by Toyo Seiki Seisaku-sho, Ltd., item No. "R100") to give a resin composition. The obtained resin composition was subjected to injection molding at a resin composition temperature of 230° C. and a mold temperature of 40° C. to give a resin molded body with length 300 mm×width 300 mm×thickness 2 mm. As the polypropylene was used trade name "BC10HRF" manufactured by Japan Polypropylene Corporation. As the carbon fibers were used trade name "XN-100" milled fibers (fiber length: 50 μm) manufactured by Nihon Glass Fiber Industrial Co., Ltd.

Comparative Example 6

Polypropylene (PP) as the thermoplastic resin in an amount of 100 parts by weight, 10 parts by weight of oil-furnace black as the carbon black, and 5 parts by weight of stainless steel long fibers (stainless steel fibers) as the metal fibers were melt-kneaded at 200° C. with LABO PLASTOMILL (manufactured by Toyo Seiki Seisaku-sho, Ltd., item No. "R100") to give a resin composition. The obtained resin composition was subjected to injection molding at a resin composition temperature of 230° C. and a mold temperature of 40° C. to give a resin molded body with length 300 mm×width 300 mm×thickness 2 mm. As the polypropylene was used trade name "BC10HRF" manufactured by Japan Polypropylene Corporation. As the oil-furnace black was used trade name "EC600JD" (DBP oil absorption: 495 ml/100 g, primary particle size: 34 nm) manufactured by LION SPECIALTY CHEMICALS CO., LTD. As the stainless steel long fibers (stainless steel fibers) was used stainless steel long-fiber masterbatch (manufactured by Daicel Polymer ltd., trade name "PP-SF50," concentration: 50%, diameter: 10 μm, fiber length: 7 mm).

Comparative Example 7

Polypropylene (PP) as the thermoplastic resin in an amount of 100 parts by weight, 10 parts by weight of oil-furnace black as the carbon black, and 100 parts by weight of carbon fibers as the fibrous filler were melt-kneaded at 200° C. with LABO PLASTOMILL (manufactured by Toyo Seiki Seisaku-sho, Ltd., item No. "R100") to give a resin composition. The obtained resin composition was subjected to injection molding at a resin composition temperature of 230° C. and a mold temperature of 40° C. to give a resin molded body with length 300 mm×width 300 mm×thickness 2 mm. As the polypropylene was used trade name "BC10HRF" manufactured by Japan Polypropylene Corporation.

The oil-furnace black was used trade name "EC600JD" (DBP oil absorption: 495 ml/100 g, primary particle size: 34 nm) manufactured by LION SPECIALTY CHEMICALS CO., LTD. As the carbon fibers were used trade name "XN-100" milled fibers (fiber length: 50 μm) manufactured by Nihon Glass Fiber Industrial Co., Ltd.
(Evaluation Methods)

The resin molded bodies obtained in the examples and the comparative examples were evaluated as follows. Tables 1 to 4 below show results of the evaluation.
<Electromagnetic Wave Shielding Effect Ratio a$\lambda$y/a$\lambda$x at Frequency of 10 MHz>

The electromagnetic wave shielding effect (unit; dB) at a frequency of 10 MHz was measured with electromagnetic wave shielding effect measuring device MA8602B (manufactured by ANRITSU) by a KEC method (KEC: abbreviation of "KEC Electronic Industry Development Center"). Specifically, the electric field intensity was measured between a probe to which a signal transmitting antenna for transmitting pseudonoise was attached and a probe to which a receiving antenna was attached. An electric field intensity before insertion of a sample E0 and an electric field intensity after insertion of a sample between both the probes E were measured, and the electromagnetic wave shielding effect was calculated according to the following equation (2).

$$\text{Electromagnetic wave shielding effect} = 20 \log 10(E0/E) \quad \text{Equation (2)}$$

The measurement frequency range was set at 0.1 MHz to GHz, and item No. "Spectrum analyzer N9000A" manufactured by Agilent Technologies, Inc. was used as a measuring apparatus. The sample of the resin molded body had a dimension of 150 mm×150 mm×2.0 mm. The anisotropy of the electromagnetic wave shielding effect was measured as follows. A sample piece was set at any direction whose position was defined as 0°, and the sample was rotated by 15° intervals. The sample was measured for its electromagnetic wave shielding effect at 0°, 15°, 30°, 45°, 60°, 75°, 90°, 105°, 120°, 135°, 150°, 165°, and 180°, and a direction in which electromagnetic wave shielding effect is maximum was defined as the x-direction, and a direction perpendicular to the x-direction was defined as the y-direction. The x-direction electromagnetic wave shielding effect at a frequency of 10 MHz was defined as a$\lambda$x and the y-direction electromagnetic wave shielding effect was defined as a$\lambda$y.
<Electromagnetic Wave Shielding Effect at Frequency of 3 GHz (dB)>

The electromagnetic wave shielding effect (electromagnetic wave shielding performance, unit: dB) at a frequency of 3 GHz was measured with shield property measuring device Dual-Focus Flat Cavity (DFFC) (manufactured by Sanken). Specifically, an electromagnetic wave was radiated from a transmission-side focus, and the intensity of an electromagnetic wave converged to a reception-side focus was measured as a reception voltage. A reception voltage before insertion of a sample V0 and a reception voltage after insertion of a sample V were measured, and the electromagnetic wave shielding effect was calculated according to the following equation (3).

$$\text{Electromagnetic wave shielding effect} = 20 \times \log 10(V0/V) \quad \text{Equation (3)}$$

The measurement frequency range was set at 1 GHz to GHz, and item No. "Component analyzer N4375D" manufactured by Agilent Technologies, Inc. was used as a measuring apparatus. The sample of the resin molded body had a dimension of 300 mm×20 mm×2.0 mm.
<Electromagnetic wave shielding effect (dB) and electromagnetic wave shielding effect ratio b$\lambda$y/b$\lambda$x at frequencies of 25 GHz, 50 GHz, and 75 GHz>

The electromagnetic wave shielding effect (unit: dB) at frequencies of 25 GHz, 50 GHz, and 75 GHz was measured with electromagnetic wave transmission attenuation measuring equipment DPS 10 manufactured by KEYCOM Corporation. Specifically, an electromagnetic wave was radiated from a transmission-side antenna, and the intensity of an electromagnetic wave detected at a reception-side antenna was measured as a reception voltage. A reception voltage before insertion of a sample V0 and a reception voltage after insertion of a sample V were measured, and the electromagnetic wave shielding effect was calculated according to the equation (3).

The measurement frequency range was set at 18.5 GHz to 26.5 GHz, 40 GHz to 60 GHz, and 60 GHz to 90 GHz, and item No. "Vector network analyzer ME7838A" manufactured by ANRITSU was used as a measuring apparatus. The sample of the resin molded body had a dimension of 150 mm×150 mm×2.0 mm. The anisotropy of the electromagnetic wave shielding effect was measured as follows. A sample piece was set at any direction whose position was defined as 0°, and the sample was rotated by 15° intervals. The sample was measured for its electromagnetic wave shielding effect at 0°, 15°, 30°, 45°, 60°, 75°, 90°, 105°, 120°, 135° 150° 165°, and 180°, and a direction in which electromagnetic wave shielding effect is maximum was defined as the x-direction, and a direction perpendicular to the x-direction was defined as the y-direction. The x-direction electromagnetic wave shielding effect at any one of frequencies 25 GHz, 50 GHz, and 75 GHz was defined as b$\lambda$x and the y-direction electromagnetic wave shielding effect at a frequency identical with the any one of the frequencies was defined as b$\lambda$y.
<In-Plane Thermal Conductivity (W/(m·K))>

The in-plane thermal conductivity was measured with item No. "Xenon flash laser analyzer LFA467 HyperFlash" manufactured by NETZSCH Japan K.K. Specifically, a measurement sample with length 10 mm×width 2 mm×thickness 2 mm was punched out from the resin molded body molded at length 300 mm×width 300 mm×thickness 2 mm by the method described in the examples and the comparative examples. The measurement sample was fitted in a holder while directed so as to allow the measurement of the in-plane thermal conductivity, the measurement sample was measured for its coefficient of thermal diffusivity at 30° C., and the thermal conductivity was calculated according to the following equation (4). The density was measured with trade name "MDS-300" manufactured by Alfa Mirage Co., Ltd. The specific heat was measured by trade name "DSC-6200" manufactured by Seiko Instruments Inc.

$$\text{Thermal conductivity (W/(m·K))} = \text{Density (g/cm}^3\text{)} \times \text{Specific heat (J/(g·K))} \times \text{Coefficient of thermal diffusivity (mm}^2\text{/s)} \qquad \text{Equation (4)}$$

TABLE 1

| | | | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| Thermoplastic resin | | Type | PP | PP | PP | PP | PP | PP | PP | PP | PP | PP |
| | | Content (part by weight) | 100 | 100 | 100 | 100 | 100 | 100 | 100 | 100 | 100 | 100 |
| Graphite particles | Scale-like graphite particles (before kneading) | Content (part by weight) | 100 | 70 | 150 | 180 | 100 | 100 | 100 | 100 | 100 | 100 |
| | | Average particle size (μm) | 35 | 35 | 35 | 35 | 35 | 35 | 35 | 35 | 35 | 35 |
| | Exfoliated graphite (before kneading) | Content (part by weight) | — | — | — | — | — | — | — | — | — | — |
| | | Average particle size (μm) | — | — | — | — | — | — | — | — | — | — |
| Carbon black | Oil-furnace black | DBP oil absorption (ml/100 g) | 300 | 300 | 300 | 300 | 300 | 300 | 300 | 300 | 495 | 365 |
| | | Primary particle size (nm) | 41 | 41 | 41 | 41 | 41 | 41 | 41 | 41 | 34 | 40 |
| | | Content (part by weight) | 10 | 10 | 10 | 10 | 5 | 20 | 30 | 45 | 10 | 10 |
| | Acetylene black | DBP oil absorption (ml/100 g) | — | — | — | — | — | — | — | — | — | — |
| | | Primary particle size (nm) | — | — | — | — | — | — | — | — | — | — |
| | | Content (part by weight) | — | — | — | — | — | — | — | — | — | — |
| Metal fibers | Stainless steel fibers | Content (part by weight) | — | — | — | — | — | — | — | — | — | — |
| Fibrous filler | Glass fibers | Content (part by weight) | — | — | — | — | — | — | — | — | — | — |
| Electromagnetic wave shielding effect ratio aλy/aλx at frequency of 10 MHz | | | 0.98 | 0.97 | 0.99 | 0.99 | 0.97 | 0.99 | 0.99 | 0.99 | 0.98 | 0.98 |
| Electromagnetic wave shielding effect at frequency of 3 GHz (dB) | | | 41 | 40 | 45 | 47 | 33 | 47 | 52 | 56 | 45 | 43 |
| Electromagnetic wave shielding effect at frequency of 25 GHz (dB) | | | 42 | 41 | 49 | 51 | 37 | 48 | 53 | 58 | 49 | 46 |
| Electromagnetic wave shielding effect ratio bλy/bλx at frequency of 25 GHz | | | 0.97 | 0.97 | 0.97 | 0.96 | 0.96 | 0.97 | 0.98 | 0.98 | 0.96 | 0.97 |
| Electromagnetic wave shielding effect at frequency of 50 GHz (dB) | | | 46 | 45 | 53 | 55 | 41 | 52 | 57 | 58 | 53 | 50 |
| Electromagnetic wave shielding effect ratio bλy/bλx at frequency of 50 GHz | | | 0.97 | 0.97 | 0.97 | 0.96 | 0.96 | 0.97 | 0.98 | 0.98 | 0.96 | 0.97 |
| Electromagnetic wave shielding effect at frequency of 75 GHz (dB) | | | 49 | 48 | 56 | 58 | 44 | 55 | 60 | 62 | 56 | 53 |
| Electromagnetic wave shielding effect ratio bλy/bλx at frequency of 75 GHz | | | 0.97 | 0.97 | 0.97 | 0.96 | 0.96 | 0.97 | 0.98 | 0.98 | 0.96 | 0.97 |
| In-plane thermal conductivity (W/(m·K)) | | | 7.2 | 4.1 | 9.5 | 11.2 | 7.5 | 6.9 | 6.5 | 6.1 | 7.1 | 7.0 |

TABLE 2

| | | | Example 11 | Example 12 | Example 13 | Example 14 | Example 15 | Example 16 | Example 17 | Example 18 | Example 19 | Example 20 |
|---|---|---|---|---|---|---|---|---|---|---|---|---|
| Thermoplastic resin | | Type | PP | PP | PP | PP | PP | PP | PP | PP | PP | PP |
| | | Content (part by weight) | 100 | 100 | 100 | 100 | 100 | 100 | 100 | 100 | 100 | 100 |
| Graphite particles | Scale-like graphite particles (before kneading) | Content (part by weight) | 100 | 100 | 100 | 100 | 100 | — | — | — | 100 | 100 |
| | | Average particle size (μm) | 35 | 35 | 7 | 140 | 300 | — | — | — | 35 | 35 |
| | Exfoliated graphite (before kneading) | Content (part by weight) | — | — | — | — | — | 100 | 100 | 100 | — | — |
| | | Average particle size (μm) | — | — | — | — | — | 30 | 100 | 300 | — | — |

TABLE 2-continued

| | | | | | | | | | | | | |
|---|---|---|---|---|---|---|---|---|---|---|---|---|
| Carbon black | Oil-furnace black | DBP oil absorption (ml/100 g) | 180 | — | 300 | 300 | 300 | 300 | 300 | 300 | — | — |
| | | Primary particle size (nm) | 30 | — | 41 | 41 | 41 | 41 | 41 | 41 | — | — |
| | | Content (part by weight) | 10 | — | 10 | 10 | 10 | 10 | 10 | 10 | — | — |
| | Acetylene black | DBP oil absorption (ml/100 g) | — | 177 | — | — | — | — | — | — | — | — |
| | | Primary particle size (nm) | — | 48 | — | — | — | — | — | — | — | — |
| | | Content (part by weight) | — | 10 | — | — | — | — | — | — | — | — |
| Metal fibers | Stainless steel fibers | Content (part by weight) | — | — | — | — | — | — | — | — | 10 | 5 |
| Fibrous filler | Glass fibers | Content (part by weight) | — | — | — | — | — | — | — | — | — | — |
| Electromagnetic wave shielding effect ratio $a\lambda y/a\lambda x$ at frequency of 10 MHz | | | 0.98 | 0.96 | 0.97 | 0.98 | 0.99 | 0.98 | 0.99 | 0.99 | 0.97 | 0.96 |
| Electromagnetic wave shielding effect at frequency of 3 GHz (dB) | | | 39 | 29 | 36 | 44 | 46 | 44 | 52 | 53 | 35 | 29 |
| Electromagnetic wave shielding effect at frequency of 25 GHz (dB) | | | 35 | 28 | 32 | 48 | 49 | 47 | 51 | 52 | 32 | 29 |
| Electromagnetic wave shielding effect ratio $b\lambda y/b\lambda x$ at frequency of 25 GHz | | | 0.97 | 0.97 | 0.97 | 0.96 | 0.96 | 0.96 | 0.96 | 0.96 | 0.96 | 0.96 |
| Electromagnetic wave shielding effect at frequency of 50 GHz (dB) | | | 39 | 31 | 33 | 51 | 52 | 51 | 54 | 54 | 34 | 30 |
| Electromagnetic wave shielding effect ratio $b\lambda y/b\lambda x$ at frequency of 50 GHz | | | 0.97 | 0.97 | 0.97 | 0.96 | 0.96 | 0.96 | 0.96 | 0.96 | 0.96 | 0.96 |
| Electromagnetic wave shielding effect at frequency of 75 GHz (dB) | | | 42 | 33 | 34 | 53 | 53 | 52 | 56 | 57 | 36 | 31 |
| Electromagnetic wave shielding effect ratio $b\lambda y/b\lambda x$ at frequency of 75 GHz | | | 0.97 | 0.97 | 0.97 | 0.96 | 0.96 | 0.96 | 0.96 | 0.96 | 0.96 | 0.96 |
| In-plane thermal conductivity (W/(m · K)) | | | 6.8 | 8.0 | 5.6 | 8.5 | 11.5 | 8.6 | 15.5 | 12.8 | 7.2 | 7.5 |

TABLE 3

| | | | Example 21 | Example 22 | Example 23 | Example 24 | Example 25 | Example 26 | Example 27 | Example 28 | Example 29 | Example 30 |
|---|---|---|---|---|---|---|---|---|---|---|---|---|
| Thermoplastic resin | | Type | PP | PP | ABS | PA | PC | PPS | PBT | SPS | PP | PP |
| | | Content (part by weight) | 100 | 100 | 100 | 100 | 100 | 100 | 100 | 100 | 100 | 100 |
| Graphite particles | Scale-like graphite particles (before kneading) | Content (part by weight) | 100 | 100 | 100 | 100 | 100 | 100 | 100 | 100 | 100 | 100 |
| | | Average particle size (μm) | 35 | 35 | 35 | 35 | 35 | 35 | 35 | 35 | 35 | 35 |
| | Spherical graphite (before kneading) | Content (part by weight) | — | — | — | — | — | — | — | — | — | — |
| | | Average particle size (μm) | — | — | — | — | — | — | — | — | — | — |
| Carbon black | Oil-furnace black | DBP oil absorption (ml/100 g) | — | — | 300 | 300 | 300 | 300 | 300 | 300 | 300 | 300 |
| | | Primary particle size (nm) | — | — | 41 | 41 | 41 | 41 | 41 | 41 | 41 | 41 |
| | | Content (part by weight) | — | — | 10 | 10 | 10 | 10 | 10 | 10 | 10 | 10 |
| | Acetylene black | DBP oil absorption (ml/100 g) | — | — | — | — | — | — | — | — | — | — |
| | | Primary particle size (nm) | — | — | — | — | — | — | — | — | — | — |
| | | Content (part by weight) | — | — | — | — | — | — | — | — | — | — |
| Metal fibers | Stainless steel fibers | Content (part by weight) | 20 | 30 | — | — | — | — | — | — | — | — |
| Fibrous filler | Glass fibers | Content (part by weight) | — | — | — | — | — | — | — | — | 20 | 100 |
| | Carbon fibers | Content (part by weight) | — | — | — | — | — | — | — | — | — | — |
| Electromagnetic wave shielding effect ratio $a\lambda y/a\lambda x$ at frequency of 10 MHz | | | 0.96 | 0.98 | 0.95 | 0.94 | 0.94 | 0.95 | 0.94 | 0.93 | 0.97 | 0.95 |
| Electromagnetic wave shielding effect at frequency of 3 GHz (dB) | | | 40 | 45 | 39 | 35 | 36 | 34 | 36 | 38 | 41 | 40 |
| Electromagnetic wave shielding effect at frequency of 25 GHz (dB) | | | 36 | 40 | 41 | 39 | 38 | 37 | 37 | 38 | 42 | 41 |

TABLE 3-continued

| | | | | | | | | | | |
|---|---|---|---|---|---|---|---|---|---|---|
| Electromagnetic wave shielding effect ratio bλy/bλx at frequency of 25 GHz | 0.95 | 0.95 | 0.95 | 0.94 | 0.92 | 0.94 | 0.93 | 0.93 | 0.96 | 0.95 |
| Electromagnetic wave shielding effect at frequency of 50 GHz (dB) | 39 | 42 | 40 | 39 | 37 | 35 | 39 | 37 | 44 | 42 |
| Electromagnetic wave shielding effect ratio bλy/bλx at frequency of 50 GHz | 0.95 | 0.95 | 0.94 | 0.93 | 0.93 | 0.93 | 0.93 | 0.93 | 0.96 | 0.95 |
| Electromagnetic wave shielding effect at frequency of 75 GHz (dB) | 40 | 44 | 40 | 38 | 37 | 34 | 38 | 37 | 45 | 44 |
| Electromagnetic wave shielding effect ratio bλy/bλx at frequency of 75 GHz | 0.95 | 0.95 | 0.94 | 0.92 | 0.92 | 0.93 | 0.92 | 0.92 | 0.96 | 0.95 |
| In-plane thermal conductivity (W/(m · K)) | 6.8 | 5.2 | 5.7 | 6.5 | 5.8 | 5.6 | 6.1 | 5.7 | 6.8 | 4.8 |

TABLE 4

| | | | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|
| Thermoplastic resin | | Type | PP | PP | PP | PP | PP | PP | PP |
| | | Content (part by weight) | 100 | 100 | 100 | 100 | 100 | 100 | 100 |
| Graphite particles | Scale-like graphite particles (before kneading) | Content (part by weight) | 100 | — | — | — | — | — | — |
| | | Average particle size (μm) | 35 | — | — | — | — | — | — |
| | Spherical graphite (before kneading) | Content (part by weight) | — | — | 100 | — | — | — | — |
| | | Average particle size (μm) | — | — | 40 | — | — | — | — |
| Carbon black | Oil-furnace black | DBP oil absorption (ml/100 g) | — | 495 | 495 | — | — | 495 | 495 |
| | | Primary particle size (nm) | — | 34 | 34 | — | — | 34 | 34 |
| | | Content (part by weight) | — | 10 | 10 | — | — | 10 | 10 |
| | Acetylene black | DBP oil absorption (ml/100 g) | — | — | — | — | — | — | — |
| | | Primary particle size (nm) | — | — | — | — | — | — | — |
| | | Content (part by weight) | — | — | — | — | — | — | — |
| Metal fibers | Stainless steel fibers | Content (part by weight) | — | — | — | 5 | — | 5 | — |
| Fibrous filler | Glass fibers | Content (part by weight) | — | — | — | — | — | — | — |
| | Carbon fibers | Content (part by weight) | — | — | — | — | 100 | — | 100 |
| Electromagnetic wave shielding effect ratio aλy/aλx at frequency of 10 MHz | | | 0.98 | 0.99 | 0.99 | 0.89 | 0.85 | 0.89 | 0.88 |
| Electromagnetic wave shielding effect at frequency of 3 GHz (dB) | | | 18 | 17 | 15 | 18 | 17 | 21 | 21 |
| Electromagnetic wave shielding effect at frequency of 25 GHz (dB) | | | 15 | 16 | 15 | 18 | 15 | 19 | 19 |
| Electromagnetic wave shielding effect ratio bλy/bλx at frequency of 25 GHz | | | 0.98 | 0.99 | 0.99 | 0.89 | 0.83 | 0.89 | 0.85 |
| Electromagnetic wave shielding effect at frequency of 50 GHz (dB) | | | 14 | 16 | 15 | 17 | 16 | 18 | 19 |
| Electromagnetic wave shielding effect ratio bλy/bλx at frequency of 50 GHz | | | 0.98 | 0.99 | 0.99 | 0.89 | 0.83 | 0.89 | 0.85 |
| Electromagnetic wave shielding effect at frequency of 75 GHz (dB) | | | 15 | 15 | 14 | 17 | 16 | 19 | 18 |
| Electromagnetic wave shielding effect ratio bλy/bλx at frequency of 75 GHz | | | 0.98 | 0.99 | 0.99 | 0.89 | 0.83 | 0.89 | 0.85 |
| In-plane thermal conductivity (W/(m · K)) | | | 7.2 | 0.4 | 3.4 | 0.3 | 4.2 | 0.7 | 5.0 |

The invention claimed is:

1. A resin molded body consisting of a thermoplastic resin, plate-like graphite, and carbon black,
   the thermoplastic resin containing an olefin resin,
   a content of the plate-like graphite being 150 parts by weight or more and 200 parts by weight or less, relative to 100 parts by weight of the thermoplastic resin,
   the carbon black having a DBP oil absorption of 100 ml/100 g or more and 300 ml/100 g or less,
   a content of the carbon black being 1 part by weight or more and 50 parts by weight or less, relative to 100 parts by weight of the thermoplastic resin,
   the carbon black having a primary particle size of 34 nm or more and 50 nm or less, and
   the resin molded body being a heat dissipation chassis or a heat dissipation case or having a heat sink shape.

2. The resin molded body according to claim 1, including a main surface, wherein
the main surface has, with a direction in which electromagnetic wave shielding effect is maximum defined as an x-direction and a direction perpendicular to the x-direction defined as a y-direction,
a ratio $a\lambda y/a\lambda x$ of a y-direction electromagnetic wave shielding effect at a frequency of 10 MHz $a\lambda y$ to an x-direction electromagnetic wave shielding effect at a frequency of 10 MHz $a\lambda x$ of 0.90 or more, and
a ratio $b\lambda y/b\lambda x$ of a y-direction electromagnetic wave shielding effect at any one of frequencies of 25 GHz, 50 GHz, and 75 GHz bay to an x-direction electromagnetic wave shielding effect at a frequency identical with the any one of the frequencies $b\lambda x$ of 0.90 or more.

3. The resin molded body according to claim 1, wherein an electromagnetic wave shielding effect at any one of 3 GHZ, 25 GHz, 50 GHz, and 75 GHz is 20 dB or more.

4. The resin molded body according to claim 1, wherein the plate-like graphite has a volume average particle size of 5 μm or more and 500 μm or less.

5. The resin molded body according to claim 1, wherein the plate-like graphite is exfoliated graphite.

6. The resin molded body according to claim 1, wherein the carbon black is oil-furnace black.

7. The resin molded body according to claim 2, wherein the main surface has an in-plane thermal conductivity of 1 W/(m·K) or more.

8. A resin molded body consisting of a thermoplastic resin, plate-like graphite, carbon black, and glass fibers,
the thermoplastic resin containing an olefin resin,
a content of the plate-like graphite being 150 parts by weight or more and 200 parts by weight or less, relative to 100 parts by weight of the thermoplastic resin,
the carbon black having a DBP oil absorption of 100 ml/100 g or more and 300 ml/100 g or less,
a content of the carbon black being 1 part by weight or more and 50 parts by weight or less, relative to 100 parts by weight of the thermoplastic resin,
the carbon black having a primary particle size of 34 nm or more and 50 nm or less, and
the resin molded body being a heat dissipation chassis or a heat dissipation case or having a heat sink shape.

9. The resin molded body according to claim 8, wherein a content of the glass fibers is 1 part by weight or more and 200 parts by weight or less, relative to 100 parts by weight of the thermoplastic resin.

* * * * *